United States Patent [19]

Nishiura et al.

[11] Patent Number: 4,954,181
[45] Date of Patent: Sep. 4, 1990

[54] SOLAR CELL MODULE AND METHOD OF MANUFACTURE

[75] Inventors: Masaharu Nishiura; Takeshige Ichimura; Michinari Kamiyama, all of Yokosuka, Japan

[73] Assignees: Fuji Electric Company Ltd.; Fuji Electric Corporate Research and Development Ltd., Japan

[21] Appl. No.: 780,093

[22] Filed: Sep. 25, 1985

[30] Foreign Application Priority Data

Oct. 5, 1984 [JP] Japan ................................ 59-209212
Oct. 12, 1984 [JP] Japan ................................ 59-213736

[51] Int. Cl.⁵ .................... H01L 31/042; H01L 31/18
[52] U.S. Cl. ................................ 136/244; 136/249; 136/258; 437/4; 437/51; 437/173
[58] Field of Search ........ 136/244, 249 MS, 258 AM; 29/572; 427/43.1, 53.1; 156/643; 219/121 LJ; 437/4

[56] References Cited

U.S. PATENT DOCUMENTS

| | | | |
|---|---|---|---|
| 4,528,065 | 7/1985 | Yamazaki | 156/643 |
| 4,570,332 | 2/1986 | Yamauchi | 29/586 |
| 4,746,962 | 5/1988 | Yamazaki | 357/30 |
| 4,764,476 | 8/1988 | Yamazaki | 437/4 |

Primary Examiner—Aaron Weisstuch
Attorney, Agent, or Firm—Stevens, Davis, Miller & Mosher

[57] ABSTRACT

A solar cell module and method of manufacture in which the cell has a transparent substrate, an overlying transparent electrode, a layer of amorphous silicon and a metal electrode. Adjacent cells are connected in series by using a laser to divide the transparent electrode into strips and similarly dividing the metal electrode into overlying strips to define gaps between adjacent strips, with the layer of amorphous silicon lying across the gaps. That overlying portion is then crystallized by a laser beam so as to form a connection between the transparent electrode of one strip and the metal electrode of an adjacent strip.

3 Claims, 4 Drawing Sheets

SOLAR CELL MODULE AND METHOD OF MANUFACTURE

RELATED APPLICATIONS

Related applications include Ser. No. 771,623, filed Sept. 3, 1985; Ser. No. 776,670, filed Sept. 16, 1985, and Ser. No. 788,565, filed Oct. 17, 1985.

BACKGROUND OF THE INVENTION

This invention relates to a solar cell module which includes a series of connected solar cells, each using an amorphous semiconductor film as a photovoltaic cell.

Since amorphous silicon (referred to as a-Si), produced by glow discharge decomposition of a silane gas, is formed by vapor phase growth techniques to facilitate deposition in large areas, it has been expected to be useful as a material for low cost solar cells. In order to efficiently take electric power generated from solar cells, it may be preferable that a structure of a solar cell module is, for example, a configuration as shown in FIG. 2, and that unit cells are connected in series with one another. Transparent electrodes 21,22,23,24 ... are deposited on a transparent insulating substrate 1, such as glass substrate and the like, so as to obtain a strip-shaped structure. They are produced by depositing ITO (indium tin oxide) or $SnO_2$ (tin oxide) on an entire surface of the glass substrate 1 by means of electron beam, sputtering, or thermal CVD techniques, and patterning the thus deposited ITO or $SnO_2$ layer by laser patterning techniques.

A-Si layers 31,32,33,34 ... and metal electrode layers 41,42,43,44 ... are provided in the same manner as described above. In this case, for electrically connecting transparent electrode layers to metal electrode layers, respective patterns of the transparent electrodes and the a-Si layers and the metal electrodes are slightly shifted to the left, in relation to the transparent electrodes 21–24, as shown in FIG. 2, whereby transparent electrodes 21,22,23 ... are connected to metal electrodes 42,43,44 ..., respectively. The a-Si layer 31,32 ... has a laminated structure which includes, for example, a p-type layer with a thickness of 100 Å, a non-doped layer with a thickness of 0.5 $\mu$m, and an n-type layer with a thickness of 500 Å from the side near the transparent electrode.

However, when laser patterning is carried out, there remains a problem to improve the pattern accuracy. The following problems also arise:

(1) automation is difficult because of use of a batch-type process;

(2) the manufacturing cost is increased with increase of the area, since masks are employed;

(3) since three mask alignment processes are necessary, margins for the position alignment are required and the ineffective area against optical regeneration is increased; and (4) since transparent electrodes are reduced by hydrogen that is generated when patterning of the metal electrode layer is performed by etching using acids, such as phosphoric acids, nitric acids and the like, thereby decreasing the conductivity, the transparent electrode layer must be thicker than usual.

FIG. 3 shows an example of the patterning. That is, an a-Si layer 3 is deposited on the entire outer surface of patterned transparent electrodes 21,22,23,24 et seq. When the a-Si layer is patterned, its portions 51,52,53,54 ... are evaporated by applying a laser beam thereto. However, since the lower layer of each portion to be evaporated has a thickness which is stepped, the film thickness of the a-Si layer is not always held constant. Therefore, it is very difficult to find conditions for evaporating portions of the a-Si layer without damaging the transparent electrodes. If the lower layer of each transparent electrode (under the step) is removed together with each portion of the a-Si layer forming a series connection will not then be possible because the edge of the transparent electrode will be covered.

A similar problem, as described above, will arise when a metal electrode, deposited on the patterned a-Si layer, is itself patterned. At any rate, it is difficult to perform the patterning accurately in such a structure so that the lower layer has a thickness step affecting the film thickness of the upper thin layer, as shown in FIG. 2. This is best accomplished by other patterning techniques other than laser patterning.

SUMMARY OF THE INVENTION

Solving the problem of making solar cells, which may be impossible due to damaging of the pattern of a lower electrode while patterning an overlying a-Si layer, described as above, is one object of the present invention. It is an object also to provide a solar cell module which has a good yield, that is, few defects.

Another object of the present invention is to provide a method of economically making a series-connected type solar cell module.

A solar cell module according to the present invention comprises an amorphous semiconductor film provided on an insulating substrate, together with an underlying transparent electrode layer and an overlying metal electrode layer, these electrode layers including divided regions, with divided regions of the transparent electrode layer, and the metal electrode layer being arranged at positions shifted from one another, and from the semiconductor film. That is, a portion where one region of one electrode layer is overlapped with an end of the other electrode layer located on the adjacent region and being crystallized in the overlap area. Accordingly, electrical connection of solar cells constituted by transparent electrodes, amorphous semiconductor films and metal electrodes is achieved by a crystallized semiconductor to attain the object described above, because the necessity of patterning the semiconductor film is omitted.

According to another aspect of the present invention, in a method of making a solar cell module having unit cells connected in series with one another, the unit solar cells including a transparent electrode layer, an amorphous semiconductor layer and a metal electrode layer, each being successively deposited on a transparent insulating substrate and having separated regions, and vertically overlapped regions of respective layers, said method comprises successively depositing the semiconductor layer and the metal electrode layer on a transparent electrode layer having separated regions, applying a laser beam to position the metal electrode layer and the amorphous semiconductor layer, the positions being different from those of the separated portions of the transparent electrode layer, thereby separating the metal electrode layer and the amorphous semiconductor layer into desired regions, and applying a laser beam to sections surrounded by the separated portion of the transparent electrode layer, the separated portion of the metal electrode layer and the separated portion of the amorphous semiconductor layer. This laser beam is applied from an upper direction to crystallize the amorphous semiconductor layer over its entire thickness in a relatively narrow area under the laser. This object can be thus achieved by such a method. The crystallized portions of the semiconductor layer will be useful for electrical connection between the metal electrode, which is in contact with the upper surface of the semiconductor layer and which belongs to one unit solar cell, and the transparent electrode which is in contact with the lower surface of the semiconductor layer and which belongs to an adjacent unit solar cell. Consequently, respective adjacent unit solar cells will be connected in series with one another.

These drawings show preferred embodiments which are given by way of example and not of limitation.

DESCRIPTION OF PREFERRED EMBODIMENTS

Figure 1:
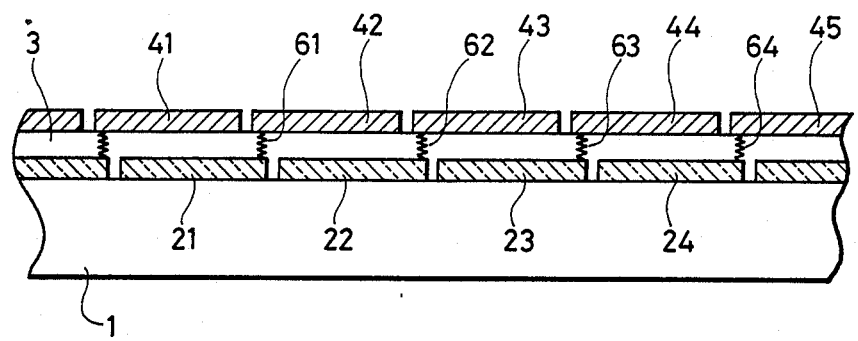
FIG. 1 is a partially sectional view showing one embodiment of the present invention.
Figure 2:
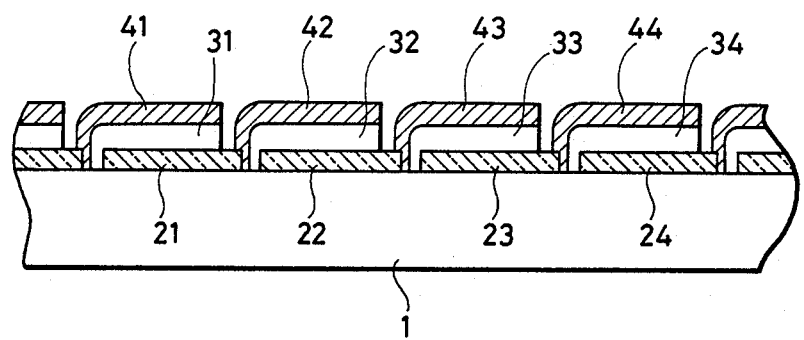
FIG. 2 is a partially sectional view showing a conventional solar cell module.
Figure 3:
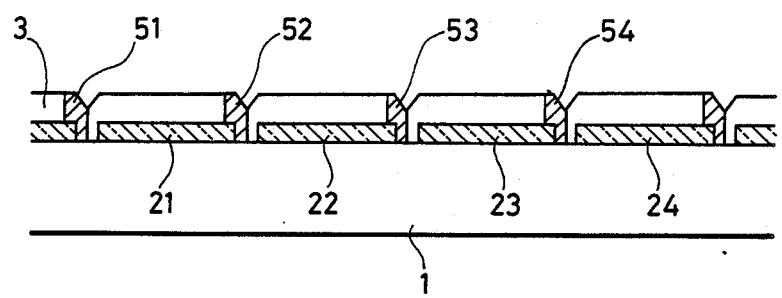
FIG. 3 is a partially sectional view of a fabricating process of the solar cell module shown in FIG. 2.

FIG. 1 shows one embodiment of the present invention, and FIGS. 4a–4d illustrate its manufacturing processes. In the drawings, similar reference numerals indicate similar parts in common with FIGS. 2 and 3. Both transparent electrode patterns 21,22,23,24 ... and metal electrode patterns 41,42,43,44 ... are provided on a transparent insulating glass substrate 1, respectively, above and below an a-Si layer 3 so that their patterns are partially overlapped. The a-Si layer 3 is polycrystallized in a highly localized area at the overlapped portions to provide low resistivity regions 61,62,63,64 ..., as shown by the shaded portions. Such a structure is obtained by the procedure shown in FIGS. 4a–4d.

Figure 4A:
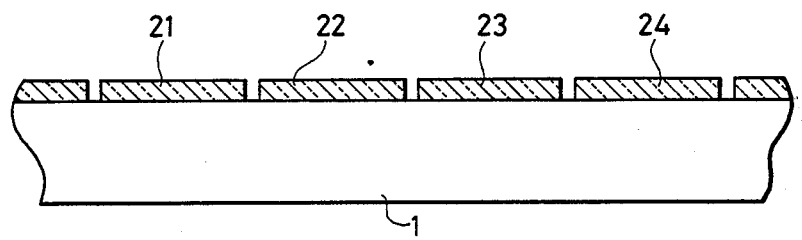
FIGS. 4a–4d are sectional views successively showing the process for making the solar cell module of FIG. 1.

A film of ITO or $SnO_2$, or a composite film of ITO/-$SnO_2$, is deposited on one surface of a glass substrate 1 to a thickness of 1000 to 7000 Å by using electron beam or thermal CVD techniques. A YAG laser beam with a diameter of about 50 μm is applied to the film while scanning it, thereby dividing the film into strips to provide separate transparent electrodes 21,22,23,24 ... thereon, as shown in FIG. 4a. At this time, $2 \times 10^7$ W/cm$^2$ is preferably used as the output power.

Figure 4B:
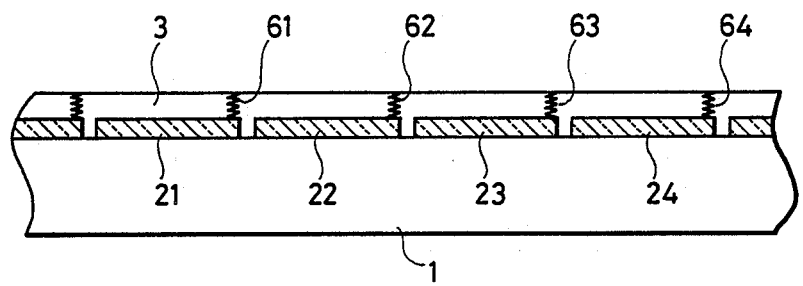

Thereafter, an a-Si layer 3 is deposited over the top of the electrodes 21,22,23,24 ..., as shown in FIG. 4b. The a-Si layer 3 has a p-i-n structure as described above. The p-type layer is provided by introducing a mixed gas of $B_2H_6$ and $SiH_4$ (mixing ratio: 1%) into a reaction chamber and decomposing it by glow discharge. The i-type layer is produced by decomposition of $SiH_4$ gas, and the n-type layer is provided by decomposing a mixed gas of $PH_3$ and $SiH_4$ (mixing ratio: 1%). A YAG laser beam is then applied to shaded portions of a-Si layer 3, each of which corresponds to one edge 61,62,63,64 ... of each transparent electrode strip, but is offset to the left, as shown in FIG. 4b. The shaded portions of a-Si layer 3 are polycrystallized to obtain low resistivity portions forming a conductive path through the a-Si layer. Several MW/cm$^2$ is preferably used as the irradiation power. A problem will probably not be caused even if the output is somewhat increased or decreased, since the laser output may be varied in output density without evaporating the a-Si layer 3; thus, control of the laser beam will be comparatively easy.

Figure 4C:
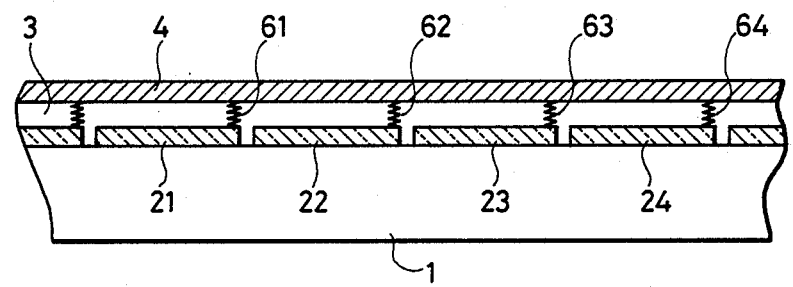
Figure 4D:
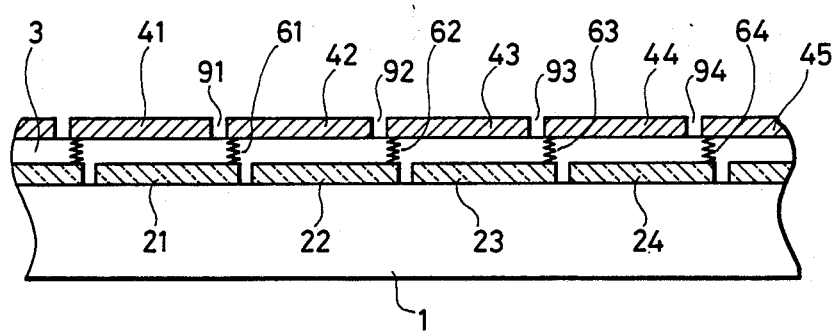

Thereafter, a metal electrode layer 4 is deposited on the a-Si layer 3 by using electron beam techniques, as shown in FIG. 4c. Al, Ti, Cr, Ta, Cu, Ni, Ag, stainless steel, or laminates of these metals, and the like are used as metals. The metal electrode layer may be provided by a single layer or laminated layer of these metals. At any rate, the thickness of the electrode layer is about 0.2 to 1 μm. Further, the metal electrode layer 4 is patterned by removing portions 91,92,93,94 ... to provide electrode patterns on strips 41,42,43,44,45 ..., as shown in FIG. 4d. The metal electrode patterns and transparent electrode patterns are positioned in such a manner that regions 61,62,63,64 ... of the polycrystallized a-Si are connected between respective adjacent offset electrode patterns. Accordingly, for example, the transparent electrode 21 is electrically connected to the metal electrode 42 through the polycrystallized region 61. Electrodes 22,43; 23,44; 24,45 ... are electrically connected to one another in the same manner as described above, thereby connecting unit cells in series with one another. 1 to $5 \times 10^6$ W/cm$^2$ is employed as the laser output for patterning the metal electrode layer. The electrode patterns can be provided under the above conditions without damaging or similarly patterning the a-Si layer 3.

A solar cell module, which includes ten series-connected cells provided on the glass substrate with 10 cm$^2$, has the following characteristics: Voc=8.8 V, Isc=130 mA, FF=0.58 and output=660 mW. When the patterning is performed by the presently described method, the space between adjacent transparent electrodes was about 50 μm, the space between adjacent metal electrodes was about 50 μm, and the overlapped length between the metal electrode and the transparent electrode was about 100 μm, respectively. Therefore, since the portion of ineffective area becomes about 0.3 mm per unit cell, about 93% of whole area can be utilized as the effective area.

Figure 5:
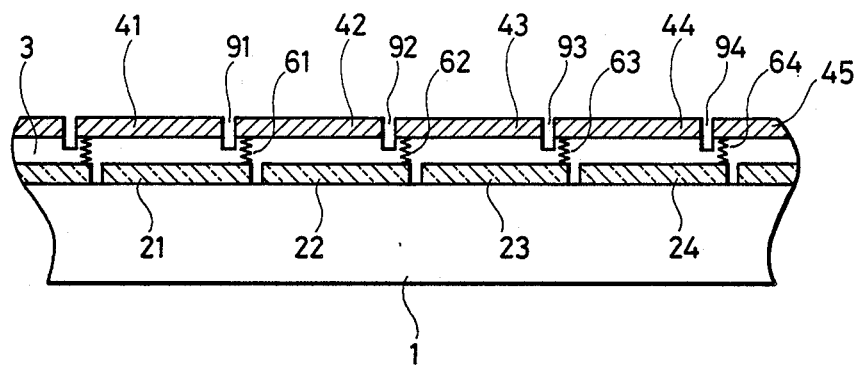
FIG. 5 is a partially sectional view showing another embodiment of the present invention.

As shown in FIG. 5, a problem did not arise, even if the output of the laser power was increased when patterning the metal electrode so as also to remove a part or all of the a-Si layer 3 directly underneath the grooves 91,92,93,94 .... By placing the solar cells in a glow discharge chamber to perform an etching by $CH_4$ gas for ten minutes to several tens of minutes, the fill factor FF was increased to 0.65, with the result that the output was increased by about 10%. It may be considered that when a part of the a-Si layer 3 under the grooves 91,92,93,94 ... in the metal electrode is patterned, the low resistivity portion 61,62,63,64 ... located under each divided metal electrode is isolated to decrease possible leakage current.

Figure 6A:
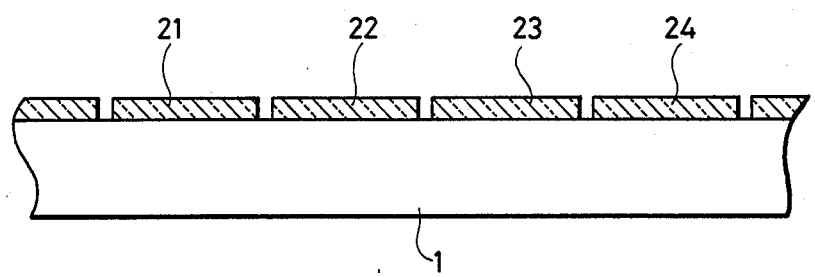
FIGS. 6a–6c are partial sectional view showing a process for a solar cell module according to another embodiment of the present invention.
Figure 6B:
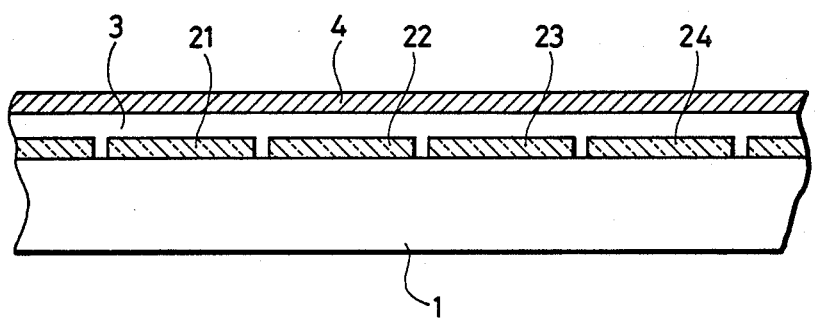
Figure 6C:
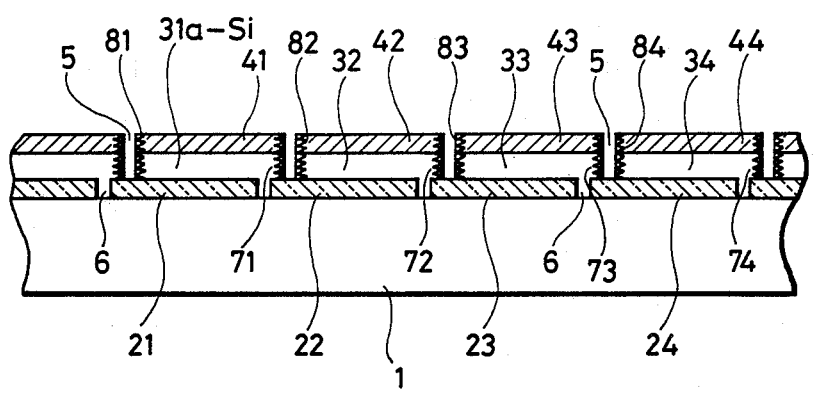

In a further embodiment, as shown in FIG. 6, a laser beam with a diameter of about 50 μm is applied both to the metal electrode layer 4 and the semiconductor layer 3 to provide simultaneously patterns 31,32,33,34 ... in the a-Si layer 3 and patterns 41,42,43,44 ... in the metal electrode. At this time 5 to $10 \times 10^6$ W/cm$^2$ was preferably used as the laser power, and the width of each removed separation 5 was about 40 μm. In this case, each separation band 5 in the metal electrodes is shifted to the right from each separation band 6 in the transparent electrodes 21,22 . . . . Thereafter, a subsequent laser beam was applied to each portion extending between the upper side of the separation band 6 of the transparent electrode and the separation band 5 of a-Si region and metal electrode. The power of the laser beam was below $2 \times 10^6$ W/cm$^2$, preferably 0.1 to $1 \times 10^6$ W/cm$^2$. Due to application of the subsequent laser beam, metal electrodes 41,42 . . . are partially melted in the irradiated regions 71,72,73,74 . . . and crystallization of a-Si regions 31,32 . . . is caused by the heat, as shown in FIG. 6. As a result, for example, a unit solar cell comprising the transparent electrode 21, the a-Si layer 31 and the metal electrode 41 are connected through the low resistivity polycrystalline Si layer of laser irradiated portion 71 in series with a unit solar cell, comprising the transparent electrode 22, the a-Si layer 32 and the metal electrode 42, i.e., the metal electrode 41 and the transparent electrode 22 are connected through the polycrystalline Si (conductive) layer in the hatched portion 71 to each other. Another group of cells are connected to one another in the same manner as described above.

A solar cell module, which includes series connection of ten unit cells provided on the glass substrate with 10 cm$^2$, had characteristics of Voc=8.8 V, Isc=130 mA, FF=0.6 and output=690 mW. The space between adjacent transparent electrodes was about 50 μm, the space between adjacent metal electrodes was about 40 μm, and the length of the overlapped portion provided between the metal electrode and the transparent electrode was about 200 μm, respectively. Accordingly, the ineffective area was below 0.5 mm per unit cell, and about 90% of whole area could be utilized as effective area.

Further, by placing the solar cell module in a glow discharge chamber to perform etching by a CH$_4$ gas for ten minutes to several tens of minutes, the fill factor FF was improved to 0.67, with the result that the output was increased by about 10%. It may be considered that low resistivity end portions 81,82,83,84 . . . of the semiconductor layers (referring to FIG. 6) are removed by the laser beam irradiation for the patterning to decrease the leakage current, thereby improving the junction characteristics.

The inventors have confirmed that when the laser beam power in the patterning is reduced to 3 to $4 \times 10^6$ W/cm$^2$, the lower portion of a-Si layer 3 is not removed, but that if the doped layer of the metal electrode side is removed, a problem does not arise in preserving the characteristics of the solar cell module.

According to the present invention, the amorphous semiconductor layer and the metal electrode layer, provided on the transparent electrode of the series-connected type solar cell module, are patterned in common by laser machining while shifting them to one side from the transparent electrode patterns thereunder and the amorphous semiconductor layer intervened between the overlapped transparent electrode and the metal electrode is crystallized to decrease the resistivity. Electrical connection among adjacent unit solar cells is then carried out. Consequently, if the patterning of the transparent electrode layer is performed by laser machining, all of the patterning processes are achieved by a dry process to enable automation. Further, since it is not necessary to use masks, the crystallization of the amorphous semiconductor is carried out by the same laser device. Furthermore, as the amorphous semiconductor layer and the metal electrode layer are patterned at the same time, the number of patterning processes are decreased by one. Still further, since the number of times one needs to make a selection of patterning conditions is reduced, it is possible to decrease the manufacturing cost. Further, since position-alignments are finished two at a time, the margin for position alignment required for respective layers is reduced to improve the effective photovoltaic area of the solar cell module thus produced, as well as the accuracy of laser machining.

According to the first aspect of the present invention, the solar cell module with series-connected solar cells is constituted by patterned or divided transparent electrodes and metal electrodes, with an undivided amorphous semiconductor film sandwiched between these electrodes, and the connection among cells is carried out by crystallizing the regions of the semiconductor film which lie across the divided areas of the electrodes. Accordingly, the patterning of the amorphous semiconductor film will not be required, and patterning with high accuracy will not be demanded to improve the manufacturing yield. In addition, the ineffective area compared with the area of power generation can be decreased.

The present invention is not limited to a solar cell module provided on a transparent insulating substrate, and can be applicable to a solar cell module provided on an opaque insulating substrate and having a transparent electrode on an a-Si layer. Further, the present invention can be applicable to a case where the patterning is performed by etching.

We claim:
1. A solar cell module, comprising:
   an insulating substrate carrying a transparent electrode on one surface;
   an amorphous semiconductor film overlying said transparent electrode;
   a metal electrode layer overlying said semiconductor film;
   each of said electrode, film and layer being divided into regions to form a plurality of adjacent cells, said divided regions of the transparent electrode and said metal layer being in positions shifted from one another to define a gap between adjacent cells; and
   said semiconductor film having a portion projecting into said gap from between said transparent electrode and said metal layer, said projecting portion being crystallized after assembly of the electrode, film and metal layer so as to form a low resistivity connection between the metal electrode layer of one cell and the transparent electrode of an adjacent cell.

2. A method of making a solar cell module having unit solar cells connected in series with one another, each said unit solar cell including a transparent electrode, an amorphous semiconductor layer and a metal electrode layer, said method comprising:
   applying a transparent electrode layer on a substrate;
   applying a laser to the transparent electrode layer so as to form a plurality of separated regions with gaps therebetween;
   depositing an amorphous semiconductor layer lying over substantially the entire transparent electrode layer, including gaps therein;

depositing a metal electrode layer over substantially the entire surface of the semiconductor layer;

applying a first laser beam to regions of the metal electrode layer to pattern it into strips by melting portions of the metal to form gaps therein which are offset from, but generally parallel to, the gaps in the transparent electrode and simultaneously forming gaps in the semiconductor layer; and applying a subsequent laser in the gaps in the semiconductor layer to polycrystallize a portion thereof to form a path of low resistivity between the metal electrode of one cell and the transparent electrode of an adjacent cell.

3. The method of claim 2, in which the power applied to the subsequent laser is lower than the power to the first laser.

* * * * *